United States Patent
Ichihara (10) Patent No.: US 6,466,270 B1
(45) Date of Patent: Oct. 15, 2002

(54) PHASE LOCKED LOOP CIRCUIT AND METHOD OF CONTROLLING JITTER OF OSD CHARACTERS

(75) Inventor: Yukio Ichihara, Hyogo (JP)

(73) Assignees: Mitsubishi Electric System LSI Design Corporation, Itami (JP); Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/347,269

(22) Filed: Jul. 6, 1999

(30) Foreign Application Priority Data

Feb. 9, 1999 (JP) .......................................... 11-031920

(51) Int. Cl.[7] .......................... H04N 5/073; H04N 5/21
(52) U.S. Cl. ...................... 348/536; 348/569; 375/327; 327/147
(58) Field of Search ................. 348/536, 537, 348/541, 544, 569, 705; 375/327, 376, 306, 344; 345/636, 23, 24, 25, 26; 327/147, 156, 155; 331/DIG. 2; 332/127, 162; H04N 5/21, 5/073

(56) References Cited

U.S. PATENT DOCUMENTS

| | | | | |
|---|---|---|---|---|
| 4,996,596 A | * | 2/1991 | Hirao et al. ................. | 348/542 |
| 5,168,360 A | * | 12/1992 | Maeshima .................... | 348/537 |
| 5,334,954 A | * | 8/1994 | Koblitz et al. ................ | 331/20 |
| 5,629,962 A | * | 5/1997 | Okumura et al. ........... | 375/376 |
| 5,677,743 A | * | 10/1997 | Terao et al. ................. | 348/735 |
| 5,721,570 A | * | 2/1998 | Tsunoda et al. ............. | 345/213 |
| 5,889,500 A | * | 3/1999 | Chuang et al. .............. | 345/10 |
| 5,986,486 A | * | 11/1999 | Nichols ....................... | 327/156 |
| 6,133,769 A | * | 10/2000 | Fontana et al. ............. | 327/156 |
| 6,133,900 A | * | 10/2000 | Esaki ........................... | 345/127 |
| 6,137,368 A | * | 10/2000 | Cho ............................ | 331/16 |
| 6,177,959 B1 | * | 1/2001 | Bril .............................. | 348/521 |
| 6,229,399 B1 | * | 5/2001 | Tobise et al. ................. | 455/26 |
| 6,320,574 B1 | * | 11/2001 | Eglit ............................. | 345/213 |

FOREIGN PATENT DOCUMENTS

| | | |
|---|---|---|
| JP | 8-307251 | 11/1996 |
| JP | 9-121156 | 5/1997 |

\* cited by examiner

*Primary Examiner*—John Miller
*Assistant Examiner*—Jean W. Désir
(74) *Attorney, Agent, or Firm*—Burns, Doane, Swecker & Mathis, LLP (57) ABSTRACT

The phase locked loop circuit according to the present invention is configured such that the CPU changes the time constant of the variable LPF filter to an optimum value in accordance with the state of the external signal fed from outside, for example by way of a selection switch activated in accordance with a control signal fed from the CPU, the responsive rate of the PLL circuit is raised, so that it can cope with jittery movements generated due to noise or a fluctuation of the supply voltage of the PLL circuit itself. On the other hand, in a case in which an external signal fed from outside the PLL circuit includes a considerable amount of noise or signal loss in itself, or suffers a signal loss, the CPU switches the time constant of the variable low-pass filter in accordance with the state of the external signal, and thereby sets the responsive rate of the PLL circuit to an optimum level, so that a fluctuation of the PLL circuit itself is suppressed, and the jittery movements of the OSD characters can thereby be eliminated.

5 Claims, 5 Drawing Sheets

PHASE LOCKED LOOP CIRCUIT AND METHOD OF CONTROLLING JITTER OF OSD CHARACTERS

BACKGROUND OF THE INVENTION

1. Field of the Invention

The present invention relates to a phase locked loop circuit, and more particularly to a phase locked loop circuit adopted for controlling a so-called on-screen display (OSD) operation which is performed by a video cassette recorder (VCR) or the like for displaying characters on a monitor screen connected thereto, and also relates to a method of controlling jittery movements of the characters formed by the OSD operation for use in the phase locked loop circuit.

2. Description of the Related Art

Figure 5:
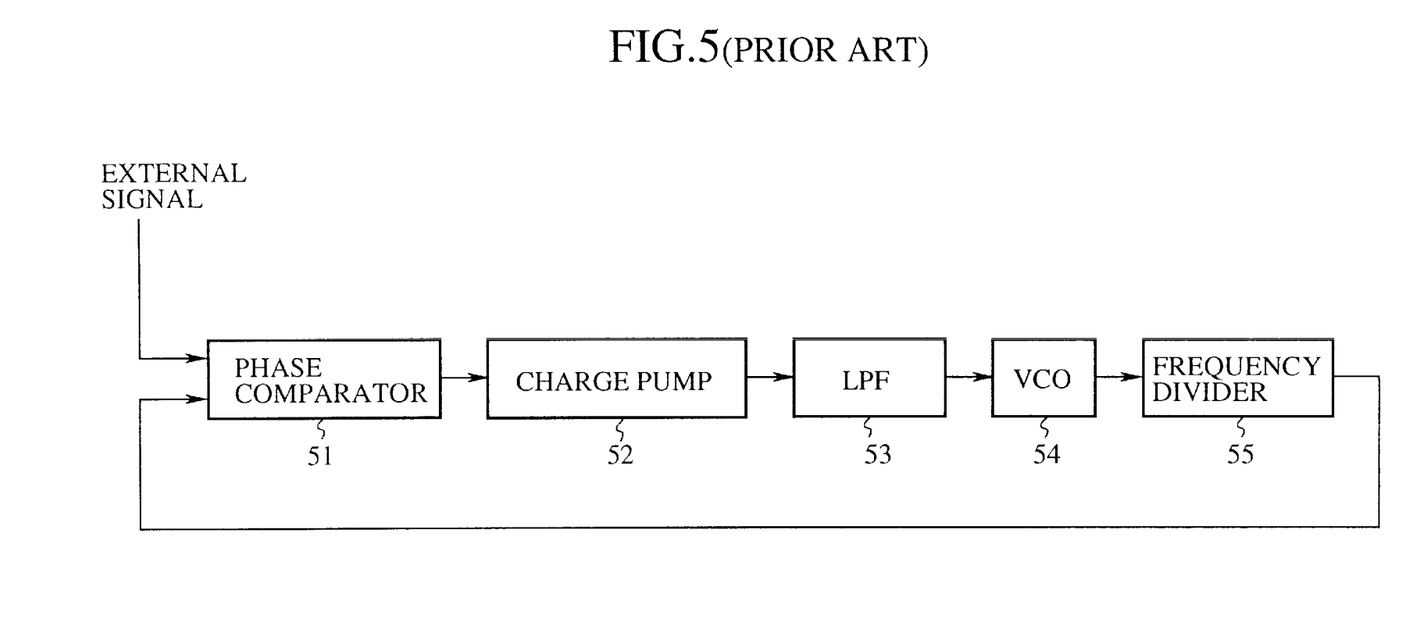
FIG. 5 is a schematic diagram showing a conventional phase locked loop circuit for use in a control of the OSD operation.

FIG. 5 is a schematic diagram showing a conventional phase locked loop circuit adopted for controlling the OSD operation. In the same figure, reference numeral 51 denotes a phase comparator, numeral 52 denotes a charge pump, numeral 53 denotes a low-pass filter (abbreviated to "LPF" hereinafter), 54 denotes a voltage-controlled oscillator (abbreviated to "VCO" hereinafter), and numeral 55 denotes a frequency divider. The output of the frequency divider 55 is fed back to the phase comparator 51.

The operation of the phase locked loop circuit (hereinafter may be referred to just as a "PLL circuit") configurated as above is now explained below.

The PLL circuit 51 detects the difference in phase between a signal input from outside the PLL circuit (hereinafter referred to as an "externally input signal" or just as an "external signal") and an output signal fed back from the frequency divider 55. The phase difference signal obtained by this detection executed in the phase comparator 51 is fed to the LPF 53 by way of the charge pump 52. The LPF 53 receives the phase difference signal, and regulates the level of the thus input phase difference signal. The signal regulated by the LPF 53 is then fed to the VCO 54 as the control signal thereof. The signal output from the VCO 54 is then fed to the frequency divider 55, and divided therein. The signal which is divided and outputted from the frequency divider 55 is then fed back to the phase comparator 51, so as to detect the phase difference between the output signal fed from the frequency divider 55 and the externally input signal.

Since the conventional PLL circuit is configurated as such, the phase locking operation is performed solely at a predetermined constant responsive rate which is determined in accordance with the time constant of the LPF 53, irrespective of the level of the external signal. Accordingly, in a case in which the PLL circuit of the above configuration is adopted for controlling the OSD operation, there has been such a drawback that it cannot efficiently cope with the jittery movements of the characters formed by the OSD operation (abbreviated hereinafter to the "OSD characters").

SUMMARY OF THE INVENTION

The present invention has been proposed to solve the problems aforementioned, and it is an object of the present invention to provide a PLL circuit equipped with a function capable of efficiently controlling the jittery movements (or simply "jitter") of the OSD characters at a high responsive rate by varying and setting the time constant of the LPF to an optimum value under control of the CPU.

In order to achieve the above object, the PLL circuit according to the first aspect of the present invention is constructed such that it comprises: a phase comparing means, a charge pump connected to the phase comparing means, a variable low-pass filter connected to the charge pump, the time constant of which is variable, a voltage-controlled oscillation means connected to the low-pass filter, a frequency dividing means connected to the voltage-controlled oscillation means, and a control means for generating and outputting a control signal for varying the time constant of the low-pass filter, wherein the phase comparing means receives an external signal used for controlling an on-screen display function and an output signal from the frequency dividing means, and detects the phase difference between the phase of the external signal and that of the output signal from the frequency dividing means, and the control means generates a control signal for changing the time constant to a predetermined value in accordance with the state of the external signal used for controlling the on-screen display function, and outputting the control signal to the variable low-pass filter to change the time constant of the variable low-pass filter, thereby to control jittery movements of the characters displayed by the on-screen display function.

According to the second aspect of the present invention, the low-pass filter in the phase locked loop circuit further comprises: a first resistor, a third resistor connectable in parallel with the first resistor, a first capacitance connected to a portion between the first resistor and the ground potential, a second resistor and a second capacitance, which are mutually connected in series, connected to a portion between the first resistor and the grand potential, and a first switching means that connects the third resistor to the first resistor in parallel in accordance with the control signal from the control means, and also connects the third resistor to the first capacitance, and to the series-connected second resistor and second capacitor, thereby to set the time constant of the variable low-pass filter to a predetermined value.

According to the third aspect of the present invention, the low-pass filter in the phase locked loop circuit further comprises: a fourth resistor, a third capacitance connected to a portion between the fourth resistor and the ground potential, a fourth capacitance and a fifth resistor, which are mutually connected in series, connectable to a portion between the fourth capacitance and the ground potential, a fifth capacitance and a;sixth resistor, which are mutually connected in series, connectable to a portion between the fourth capacitance and the ground potential, and a second switching means that connects the fourth resistor either to the series-connected fifth resistor and the fourth capacitance, or to the series-connected sixth resistor and the fifth capacitance, thereby to set the time constant of the variable low-pass filter to a predetermined value.

According to the fourth aspect of the present invention, the low-pass filter in the phase locked loop circuit further comprises:

a seventh resistor, an eighth resistor connectable in parallel with the seventh resister, a sixth capacitance connected to a portion between the seventh resistor and the ground potential, a seventh capacitance connected to a portion between the seventh resistor and the ground potential, and a third switching means that connects the eighth resister to the seventh resistor in parallel in accordance with the control signal from the control means, and also connects the eighth resistor either to the sixth capacitance or to the seventh capacitance, thereby to set the time constant of the variable low-pass filter to a predetermined value.

According to the fifth aspect of the present invention, a method of controlling jitter of characters formed by an on-screen display function by use of a phase locked loop circuit which comprises at least a phase comparator, a low-pass filter having a switching means for selecting one of at least two time constants, a voltage-controlled oscillator, and a frequency divider, includes the steps of: inputting an external signal used for controlling a non-screen display function and an output signal from the frequency divider to the phase comparator, so as to detect the phase difference between the input signals, feeding the signal indicating the phase difference to the variable low-pass filter, generating a control signal in the control means and outputting the control signal to the variable low-pass filter, and activating the switching means for selecting one of the time constants in accordance with the state of the external signal.

Since the phase locked loop circuit according to the present invention is configured such that the CPU changes the time constant of the variable LPF filter to an optimum value in accordance with the state of the external signal fed from outside, for example by way of the selection switch activated in accordance with a control signal fed from the CPU, the responsive rate of the PLL circuit is raised, so that it can cope with the jitter phenomenon generated due to noise or a fluctuation of the supply voltage of the PLL circuit itself.

On the other hand, in a case in which an external signal itself fed from outside the PLL circuit includes a considerable amount of noise or signal loss in itself, the CPU switches the time constant of the variable low-pass filter in accordance with the state of the external signal, and thereby sets the responsive rate of the PLL circuit to an optimum level, so that a fluctuation of the PLL circuit itself is suppressed, and the jitter of the OSD characters can thereby be eliminated.

DETAILED DESCRIPTION OF THE PREFERRED EMBODIMENTS

Several embodiments of the present invention are now explained below.

First Embodiment

Figure 1:
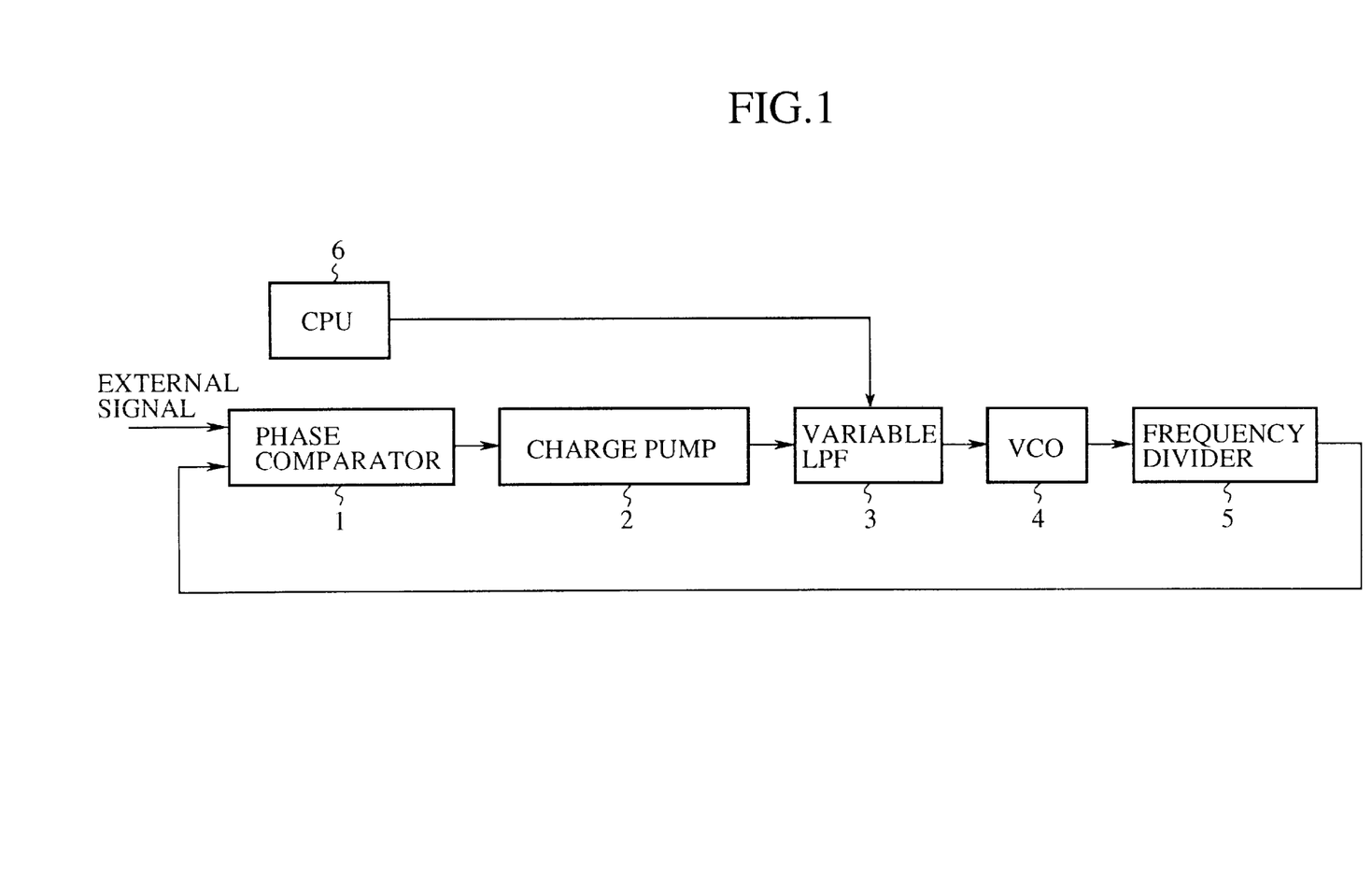
FIG. 1 is a schematic diagram showing a phase locked loop circuit according to a first embodiment of the present invention.

FIG. 1 is a schematic diagram showing a phase locked loop (PLL) circuit according to a first embodiment of the present invention.

In the figure, reference numeral 1 denotes a phase comparator as a phase comparing means, numeral 2 denotes a charge pump, numeral 3 denotes a variable low-pass filter (variable LPF), 4 denotes a voltage-controlled oscillator (VCO), numeral 5 denotes a frequency divider, and reference numeral 6 denotes a CPU as a control means for controlling the time constant of: the variable LPF 3 to set it to an optimum value. It is to be noted that since the frequency divider 5 is connected to the phase comparator 1 in the PLL circuit according to the present embodiment, the output from the frequency divider 5 is fed to the phase comparator 1. Accordingly, the phase comparator 1, the charge pump 2, the variable LPF 3, the VCO 4 and the frequency divider 5 form a closed-loop circuit altogether.

The operation of the PLL circuit according to the first embodiment is now explained below.

The phase comparator 1 receives an external signal from outside the PLL circuit so as to be used for controlling the OSD operation performed by a VCR, and also receives an output signal from the frequency divider 5. The output of this phase comparator 1 is fed to the variable LPF 3 by way of the charge pump 2.

The time constant of the variable LPF 3 is set to an optimum value in compliance with the state of the external signal and switched under control of the CPU 6. The output signal from the variable LPF 3 is fed to the VCO 4. The output signal from the VCO 4 is, in turn, further fed to the frequency divider 5, and thereafter the signal thus input to the frequency divider 5 is fed back to the phase comparator 1.

For example, in a case in which the PLL circuit of the present invention is adopted for controlling the OSD operation performed by a VCR, the phase comparator 1 detects. the phase difference between the external signal provided from outside the PLL circuit and the signal output from the frequency divider 5.

The phase difference signal generated and outputted from the phase comparator 1 is fed to the variable LPF 3 by way of the charge pump 2. The variable LPF 3, whose time constant is set to a desired value under control of the CPU 6, regulates the signal output from the charge pump 2. The variable LPF 3 then outputs the thus regulated signal to the VCO 4, and the signal output from the VCO 4 is further fed to the frequency divider 5. Thereafter the frequency divider divides the output signal received from the VCO 4, and feeds it back to the phase comparator 1.

In the phase comparator 1, the external signal provided from outside the PLL circuit and the output signal fed from the frequency divider 5 are compared to detect the phase difference therebetween. In the case of controlling the OSD operation performed by a VCR by use of the PLL circuit that carries out the above-mentioned series of operations, if a stable external signal is provided from outside the PLL circuit, the CPU 6 controls to set the time constant of the variable LPF 3 to a predetermined value on the basis of the state of the external signal, to thereby raise the responsive rate of the PLL circuit as a whole, so that it can cope with jittery movements of the OSD characters generated due to a fluctuation of the supply voltage or noise.

On the other hand, in a case in which there is a considerable amount of noise or signal loss in an external signal itself provided from outside the PLL circuit, the CPU 6 controls the lowers time constant of the variable LPF 3 on the basis of the state of the external signal, and thereby lowers the responsive rate of the PLL circuit as a whole, so that a fluctuation of the PLL circuit itself is suppressed, and subtle jittery movements of the OSD characters can be thereby eliminated.

As is explained heretofore, according to the first embodiment of the present invention, since it is configured such that in case the signal is stably provided, the time constant is set to an optimum value in accordance with the state of the externally input signal under control of the CPU 6, the responsive rate of the PLL circuit is raised, so that it can cope with the jitter of the OSD characters generated due to a fluctuation of the supply voltage or noise.

On the other hand, in a case in which there is a considerable amount of signal loss or noise included in an external signal itself provided from outside the PLL circuit, the CPU 6 controls the time constant of the variable LPF 3 in accordance with the state of the external signal, and thereby sets the responsive rate of the PLL circuit as a whole to an optimum level, so that a fluctuation of the PLL circuit itself is suppressed, and the jitter of the OSD characters generated due to this fluctuation is thereby eliminated.

Second Embodiment

Figure 2:
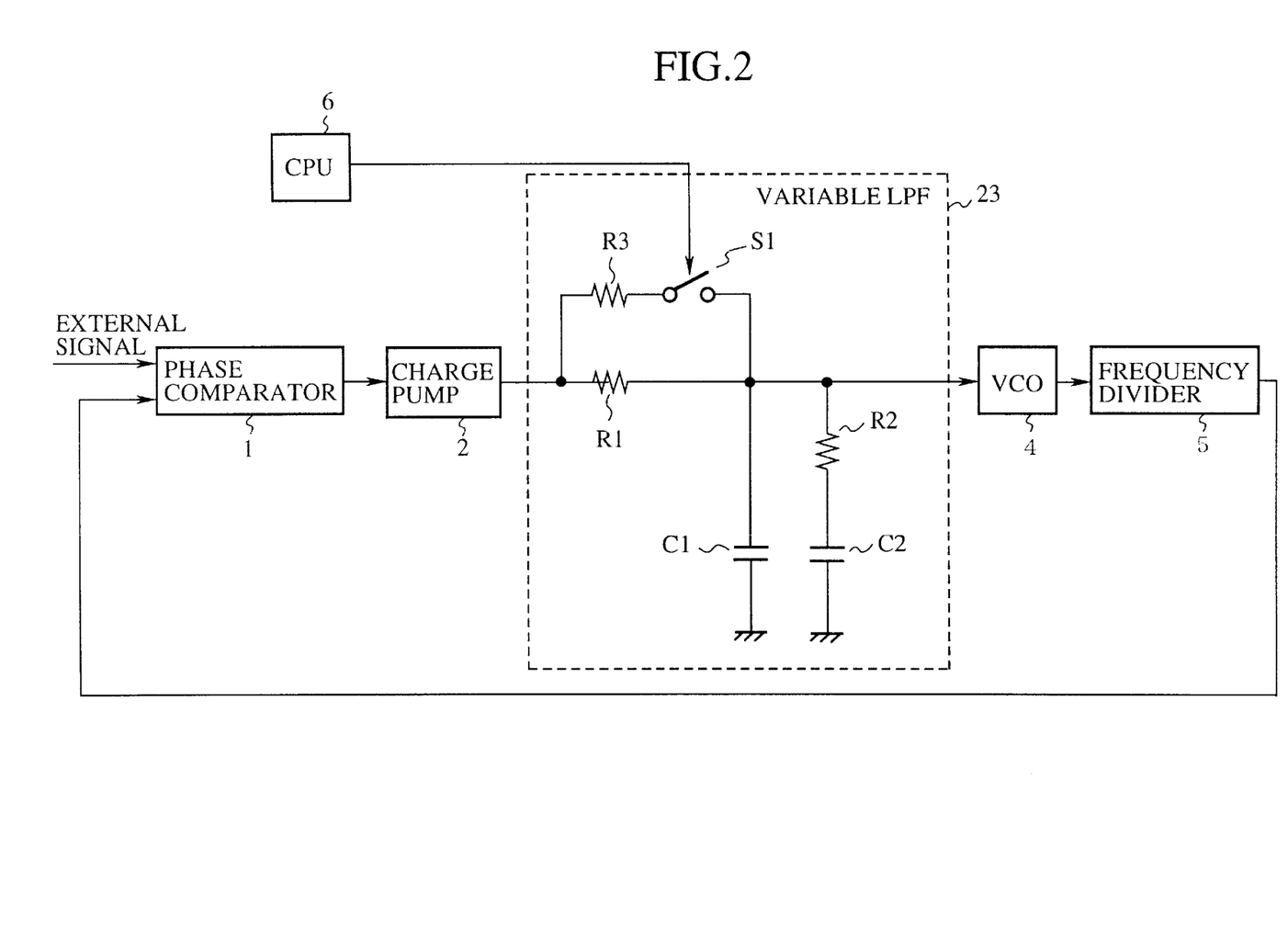
FIG. 2 is a schematic diagram showing a phase locked loop circuit according to a second embodiment of the present invention.

FIG. 2 is a schematic diagram showing a phase locked loop (PLL) circuit according to a second embodiment of the present invention.

In the figure, reference numeral 23 denotes a variable low-pass filter (variable LPF), S1 denotes a selection switch activated in accordance with a control signal from the CPU 6, R1, R2 and R3 denote a first, second and a third resistor respectively, C1 and C2 denote a first and a second capacitance respectively. It is to be noted that since the other circuit elements such as the phase comparator 1, the charge pump 2, the VCO 4, the frequency divider 5 and the CPU 6 are already explained with reference to the first embodiment, the detailed explanation about these portions is omitted here by putting the identical reference numerals.

The variable LPF 23 according to the second embodiment is composed of the capacitance C1 and C2, the resistors R1, R2 and R3, and the switching means S1, forming altogether a kind of a so-called lag-lead filter. As shown in FIG. 2, within the LPF 23, each of the capacitances C1 and C2 is connected to the portion between the R1 and the ground potential, and the resistor R3 is connected in parallel with the R1 by way of the switching means S1. Further, the control signal output from the LPF 23 is fed to the VCO 4. In this way, the phase comparator 1, the charge pump 2, the variable LPF 23, the VCO 4 and the frequency divider 5 form a kind of closed-loop circuit altogether.

The operation of the PLL circuit according to the second embodiment is now explained below.

The phase comparator 1 receives an external signal provided from outside the PLL circuit and an output signal from the frequency divider 5. The output of the phase comparator 1 is fed, by way of the charge pump 2, to the resistors R1 and R3 which are circuit elements within the variable LPF 23. The resistor R3 which is connected in parallel with the resistor R1 by way of the selecting switch S1 which is set to ON or OFF state due to the control signal from the CPU 6.

When the PLL circuit according to the present embodiment is adopted for controlling the OSD operation, the phase comparator 1 detects the phase difference between the external signal provided from outside the PLL circuit and the output signal from the frequency divider 5. The phase difference signal obtained by this detection is then fed to the variable LPF 23 by way of the charge pump 2.

The variable LPF 23 regulates the input phase difference signal, and the thus regulated phase difference signal is made to be a control signal to be fed to the VCO 4. The control signal output from the VCO 4 is divided by the frequency divider 5, and is thereafter fed back to the phase comparator 1 so as to be compared with the external signal and detect the phase difference therebetween.

When controlling the OSD operations by use of the PLL circuit that carries out the above-mentioned series of operation, if a stable external signal is provided from outside the PLL circuit, the CPU 6 sets the selection switch S1 to ON, which is a circuit element within the variable LPF 3, in order to switch the time constant of the variable LPF 3 to a predetermined value, and thereby raises the responsive rate of the PLL circuit, so that it can cope with the jittery movements of the OSD characters which is generated due to a fluctuation of the supply voltage or noise.

On the other hand, in a case in which there is a considerable amount of signal loss or noise in an external signal itself provided from outside the PLL circuit, the CPU 6 sets the selection switch S1 to OFF, in order to switch the time constant of the variable LPF 23, and thereby lowers the responsive rate of the PLL circuit, so that a fluctuation of the PLL circuit itself is suppressed, and subtle jittery movements of the OSD characters can be thereby eliminated.

As is explained heretofore, according to the second embodiment of the present invention, since it is configured such that the CPU 6 sets the time constant to an optimum value in accordance with the state of the externally input signal in case the external signal is stably provided, the responsive rate of the PLL circuit as a whole is raised, so that it can cope with the jittery movements of the OSD characters which is generated due to a fluctuation of the supply voltage or noise.

On the other hand, in a case in which an external signal fed from outside the PLL circuit includes a considerable amount of noise or signal loss in itself, the CPU 6 switches the time constant of the variable LPF 3 in accordance with the state of the external signal, and thereby setting the responsive rate of the PLL circuit to an optimum level, so that a fluctuation of the PLL circuit itself is suppressed, and the jitter of the OSD characters generated due to this fluctuation can thereby be eliminated.

Third Embodiment

Figure 3:
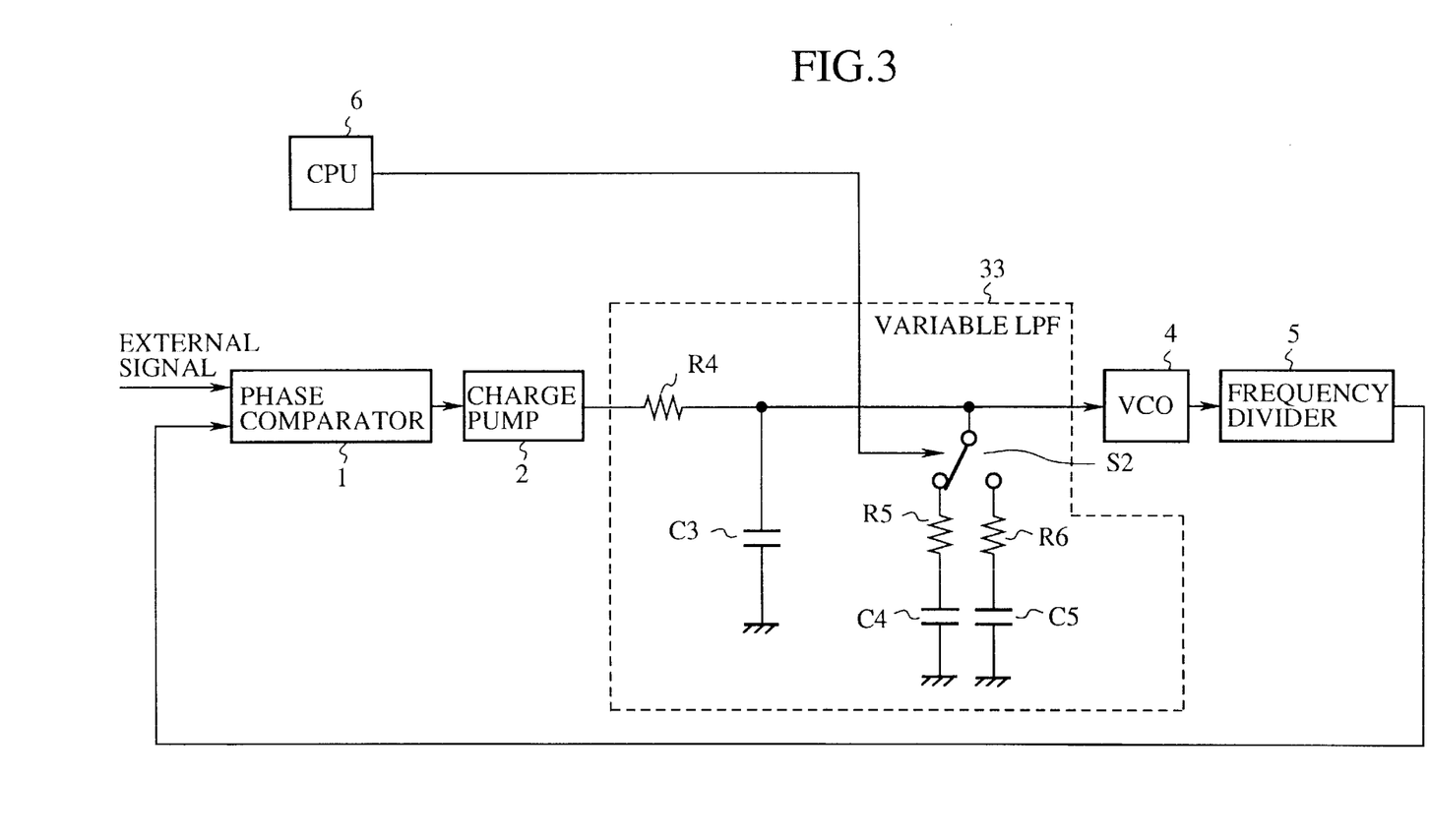
FIG. 3 is a schematic diagram showing a phase locked loop circuit according to a third embodiment of the present invention.

FIG. 3 is a schematic diagram showing a phase locked loop (PLL) circuit according to a third embodiment of the present invention.

In the figure, reference numeral 33 denotes a variable low-pass filter (variable LPF), S2 denotes a selection switch actuated in accordance with a control from the CPU 6, R4, R5 and R6 denote a fourth, fifth and a sixth resistors respectively, and C3, C4 and C5 denote a third, fourth and a fifth capacitance respectively. As shown in FIG. 3, in the variable LPF 33, the capacitance C3 is connected to the portion between the. resistor R4 and the ground potential, the resistor R5 and the capacitance C4 are connected in series between the resistor R4 and the ground potential by way of the selection switch S2, and the resistor R6 and the capacitance C5 are connected in series between the resistor R4 and the ground potential by way of the selection switch S2.

As explained above, the variable LPF 33 in the PLL circuit according to the present embodiment is composed of the capacitances C3, C4 and C5, the resistors R4, R5 and R6, and the selection switch S2, forming altogether a kind of a so-called lag-lead filter. The control signal output from the variable LPF 33 is fed to the VCO 4. It is to be noted that since the other circuit elements such as the phase comparator 1, the charge pump 2, VCO 4, the frequency divider 5 and the CPU 6 are already explained with reference to the first embodiment, the detailed explanation about these portions is omitted here by putting the identical reference numerals. In this way, the phase comparator 1, the charge pump 2, the variable LPF 3, the VCO 4 and the frequency divider 5 form a kind of closed-loop circuit altogether.

The operation of the PLL circuit according to the third embodiment is now explained below.

The phase comparator 1 receives an external signal from outside the PLL circuit and an output signal from the frequency divider 5. The output of the phase comparator 1 is fed, by way of the charge pump 2, to the resistor R4 provided within the variable LPF 33. The resistor R5 and the capacitance C4, which are mutually connected in series, are connected in parallel with the resistor R6 and the capacitance C5, which are also connected mutually in series, and they are connected to the resistor R4 and the capacitance C3, by way of the selecting switch S2 which is set to ON or OFF state in accordance with the control signal from the CPU 6.

When the PLL circuit according to the present embodiment is adopted for controlling the OSD operation performed by a VCR, the phase comparator 1 detects the phase difference between the external signal provided from outside the PLL circuit and the output signal from the frequency divider 5. The phase difference signal obtained by the detection is fed to the variable LPF 33 by way of the charge pump 2.

The variable LPF 33 regulates the input phase difference signal, and the thus regulated phase difference signal is made to be a control signal to be fed to the VCO 4. The control signal output from the VCO 4 is divided by the frequency divider 5, and is thereafter fed back to the phase comparator 1 so as to be compared with the external signal and detect the phase difference therebetween.

When controlling the OSD operation by use of the PLL circuit that carries out the above-mentioned series of operations, the CPU 6 sets either to the time constant of the variable LPF 33 formed by the resistors R4, R5 and the capacitance C4, or to the time constant formed by the resistors R4, R6 and the capacitance C5 by switching the selection switch S2 so as to change the responsive rate of the PLL circuit, so that it can cope with jitter of the OSD characters generated due to a fluctuation of the supply voltage or noise, and also suppress the fluctuation of the PLL circuit itself, whereby subtle jittery movements of the OSD characters can be eliminated.

As is explained heretofore, according to the third embodiment of the present invention, since the time constant of the variable LPF 3 is changed, under control of the CPU 6, to an optimum value under control of the CPU 6 in accordance with the state of the external signal fed from outside, the responsive rate of the PLL circuit is raised, so that it can cope with the jitter of the OSD characters generated due to a fluctuation of the supply voltage or noise.

In addition, in a case in which an external signal provided from outside the PLL circuit includes a considerable amount of noise or signal loss in itself, the CPU 6 switches the time constant of the variable PLF 33 in accordance with the state of the external signal, and thereby setting the responsive rate of the PLL circuit to an optimum level, so that a fluctuation of the PLL circuit itself is suppressed, and the jitter of the OSD characters can thereby be eliminated.

Fourth Embodiment

Figure 4:
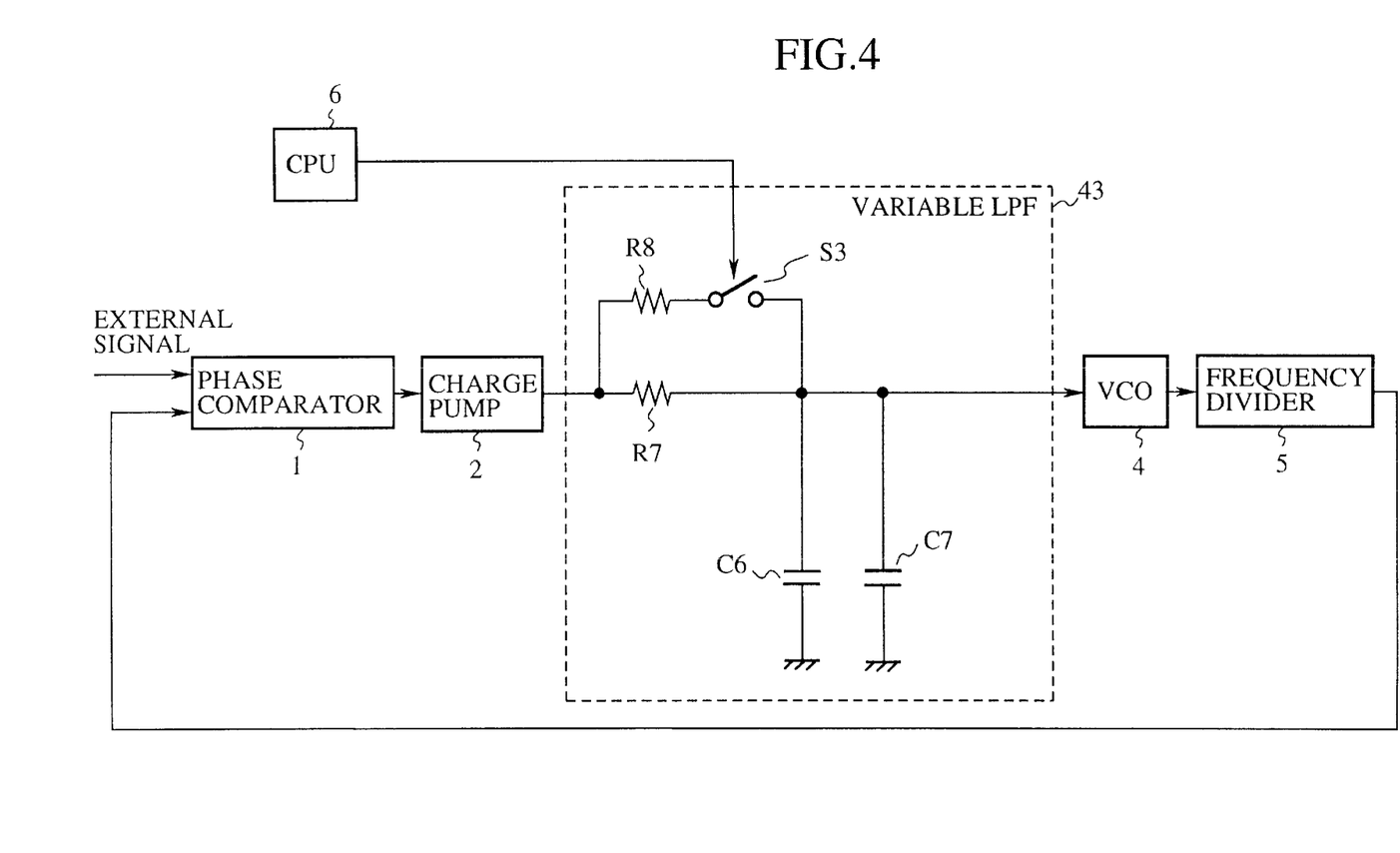
FIG. 4 is a schematic diagram showing a phase locked loop circuit according to a fourth embodiment of the present invention.

FIG. 4 is a schematic diagram showing a phase locked loop (PLL) circuit according to a fourth embodiment of the present invention.

In the figure, reference numeral 413 denotes a variable low-pass filter (variable LPF), S3 denotes a selection switch which is activated in accordance with a control signal from the CPU 6, R7 and R8 denote a seventh and a eighth resistor respectively, and C6 and C7 denote respectively a sixth and a seventh capacitance. It is to be noted that since the other circuit elements such as the phase comparator 1, the charge pump 2, VCO 4, the frequency divider and the CPU 6 are already explained with reference to the first embodiment, the detailed explanation about these portions is omitted here by putting the identical reference numerals.

The variable LPF 43 according to the present embodiment is composed of the capacitances C6 and C7, resistors R7 and R8, and the selection switch S3, forming altogether a kind of a lag-lead filter. As shown in FIG. 4, in the variable LPF 43, each of the capacitances C6 and C7 is connected to the portion between the resistor R7 and the ground potential, and the resistor R8 is connected in parallel with the resistor R7 by way of the selection switch S3. Further, the control signal fed from the variable LPF 43 is fed to the VCO 4. In this way, the phase comparator 1, the charge pump 2, the variable LPF 43, the VCO 4 and the frequency divider 5 form a closed-loop circuit altogether.

The operation of the PLL circuit according to the fourth embodiment is now explained below.

The phase comparator 1 receives an external signal from outside the PLL circuit and an output signal from the frequency divider 5. The output of the phase comparator 1 is fed, by way of the charge pump 2, to the resistor R7 provided within the LPF 43. The resistor R8 is connected to the resistor R7, capacitance C6 and the capacitance C7 by way of the selecting switch S3 which is set to ON or OFF state in accordance with the control signal from the CPU 6.

When the PLL circuit according to the present embodiment is employed for controlling the OSD operation, the phase comparator 1 detects the phase difference between the external signal provided from outside the PLL circuit and the output signal from the frequency divider 5. The phase difference signal obtained by the detection is fed to the variable LPF 43 by way of the charge pump 2.

The variable LPF 43 regulates the input phase difference signal, and the thus regulated phase difference signal is made to be a control signal to be fed to the VCO 4. The control signal output from the VCO 4 is divided by the frequency divider 5, and is thereafter fed back to the phase comparator 1 so as to be compared with the external signal and detect the phase difference therebetween.

When controlling the OSD operation by use of the PLL circuit that carries out the above-mentioned series of operations, if a stable external signal is provided from outside the PLL circuit, the responsive rate of the PLL circuit is raised by setting the selection switch S3 provided within the LPF 43 to ON, and switching the time constant of the variable LPF 43 to a predetermined value under control of the CPU 6, enabling thereby the PLL circuit to cope with jitter of the OSD characters generated due to a fluctuation of the supply voltage or noise.

On the other hand, in a case in which there is a considerable amount of noise or signal loss in an external signal provided from outside the PLL circuit, the responsive rate of the PLL circuit is lowered by setting the selection switch S3 to OFF, and switching the time constant of the variable LPF 43 under control of the CPU 6, so that a fluctuation of the PLL circuit itself is suppressed, and subtle jittery movements of the OSD characters can be thereby eliminated.

As is explained heretofore, according to the fourth embodiment of the present invention, since it is configured such that the CPU 6 switches the time constant to an optimum value in accordance with the state of the external signal in case the signal fed from outside is stably provided, the responsive rate of the PLL circuit is raised, whereby it can cope with the jitter of the OSD characters generated due to a fluctuation of the supply voltage or noise.

On the other hand, in a case in which an external signal provided from outside the PLL circuit includes a considerable amount of noise or signal loss, the CPU 6 switches the time constant of the variable LPF 43 in accordance with the state of the external signal, and thereby setting the responsive rate of the PLL circuit to an optimum level, so that a fluctuation of the PLL circuit itself is suppressed, and jittery movements of the OSD characters can thereby be eliminated.

What is claimed:

1. A phase locked loop circuit comprising:

a phase comparing means, a charge pump connected to said phase comparing means, a variable low-pass filter connected to said charge pump, and the time constant of which is variable, a voltage-controlled oscillation means connected to said low-pass filter, a frequency dividing means connected to said voltage-controlled oscillation means, and a control means for generating and outputting a control signal for varying a time constant of said variable low-pass filter, wherein said phase comparing means receives an external signal used for controlling an on-screen display function and an output signal from said frequency dividing means, and detects the phase difference between the phase of the external signal and that of the output signal from said frequency dividing means, and said control means generates a control signal for changing the time constant to a predetermined value in accordance with the state of the external signal used for controlling the on-screen display function, and outputting said control signal to said variable low-pass filter to change the time constant of said variable low-pass filter, thereby to control jittery movements of the characters displayed by the on-screen display function.

2. A phase locked loop circuit according to claim 1, wherein said low-pass filter further comprising:

a first resistor, a third resistor connectable in parallel with said first resistor, a first capacitance connected to a portion between said first resistor and the ground potential, a second resistor and a second capacitance, which are mutually connected in series, connected to a portion between said first resistor and said grand potential, and a first switching means that connects said third resistor to said first resistor in parallel in accordance with the control signal from said control means, and also connects said third resistor to said first capacitance, and to said series-connected second resistor and second capacitor, thereby to set the time constant of said variable low-pass filter to a predetermined value.

3. A phase locked loop circuit according to claim 1, wherein said low-pass filter further comprising:

a fourth resistor, a third capacitance connected to a portion between said fourth resistor and the ground potential, a fourth capacitance and a fifth resistor, which are mutually connected in series, connectable to a portion between said fourth capacitance and said ground potential, a fifth capacitance and a sixth resistor, which are mutually connected in series, connectable to a portion between said fourth capacitance and said ground potential, and a second switching means that connects said fourth resistor either to said series-connected fifth resistor and said fourth capacitance, or to said series-connected sixth resistor and said fifth capacitance, thereby to set the time constant of said variable low-pass filter to a predetermined value.

4. A phase locked loop circuit according to claim 1, wherein said variable low-pass filter further comprises:

a seventh resistor, an eighth resistor connectable in parallel with said seventh resister, a sixth capacitance connected to a portion between said seventh resistor and the ground potential, a seventh capacitance connected to a portion between said seventh resistor and the ground potential, and a third switching means that connects said eighth resister to said seventh resistor in parallel in accordance with the control signal from said control means, and also connects said eighth resistor either to said sixth capacitance or to said seventh capacitance, thereby to set the time constant of'said variable low-pass filter to a predetermined value.

5. A method of controlling jitter of characters formed by an on-screen display function by use of a phase locked loop circuit that comprises at least a phase comparator, a variable low-pass filter having a switching means for selecting one of at least two time constants, a voltage-controlled oscillator, a frequency divider and a control means, said method including the steps of:

inputting an external signal used for controlling an on-screen display function and an output signal from said frequency divider to said phase comparator, so as to detect the phase difference between said input signals, feeding the signal indicating said phase difference to said variable low-pass filter, generating a control signal in said control means and outputting said control signal to said variable low-pass filter, and activating said switching means for selecting one of said time constants in accordance with the state of said external signal.

* * * * *